US008286025B1

(12) United States Patent
Pritchard et al.

(10) Patent No.: US 8,286,025 B1
(45) Date of Patent: Oct. 9, 2012

(54) SELECTION OF PORT ADAPTERS FOR CLOCK CROSSING BOUNDARIES

(75) Inventors: Jeffrey Orion Pritchard, Santa Cruz, CA (US); Paul Norbert Scheidt, Santa Cruz, CA (US); Timothy P. Allen, Santa Cruz, CA (US)

(73) Assignee: Altera Corporation, San Jose, CA (US)

( * ) Notice: Subject to any disclaimer, the term of this patent is extended or adjusted under 35 U.S.C. 154(b) by 144 days.

(21) Appl. No.: 12/834,980

(22) Filed: Jul. 13, 2010

Related U.S. Application Data

(63) Continuation of application No. 11/261,688, filed on Oct. 28, 2005, now Pat. No. 7,779,286.

(51) Int. Cl.
*G06F 1/04* (2006.01)

(52) U.S. Cl. ........................... 713/600; 713/400

(58) Field of Classification Search .................. 713/400, 713/600
See application file for complete search history.

(56) References Cited

U.S. PATENT DOCUMENTS

| | | | |
|---|---|---|---|
| 3,846,763 | A | 11/1974 | Riikonen |
| 5,341,475 | A | 8/1994 | Austruy et al. |
| 5,734,334 | A | 3/1998 | Hsieh et al. |
| 5,862,373 | A | 1/1999 | Pathikonda et al. |
| 6,128,758 | A | 10/2000 | Hall et al. |
| 6,138,185 | A | 10/2000 | Nelson et al. |
| 6,378,123 | B1 | 4/2002 | Dupenloup |
| 6,539,488 | B1 | 3/2003 | Tota et al. |
| 7,080,345 | B1 | 7/2006 | Iotov |
| 7,096,310 | B2 | 8/2006 | Norden |
| 7,096,349 | B1 | 8/2006 | Hamilton |
| 7,171,548 | B2 | 1/2007 | Smith et al. |
| 7,239,669 | B2 | 7/2007 | Cummings |
| 7,382,824 | B1* | 6/2008 | Marmash et al. ............. 375/224 |
| 7,769,929 | B1 | 8/2010 | Pritchard |
| 7,779,286 | B1 | 8/2010 | Pritchard et al. |
| 2004/0041842 | A1 | 3/2004 | Lippincott |
| 2004/0230723 | A1 | 11/2004 | Rougnon-Glasson |
| 2005/0055489 | A1* | 3/2005 | Elliott ........................... 710/310 |
| 2005/0088867 | A1 | 4/2005 | Iotov et al. |
| 2005/0210177 | A1 | 9/2005 | Norden |
| 2006/0253814 | A1 | 11/2006 | Porter et al. |

OTHER PUBLICATIONS

Office Action dated Jul. 16, 2009, U.S. Appl. No. 11/261,688.
Final Office Action dated Dec. 29, 2008, U.S. Appl. No. 11/261,688.
Office Action dated Jun. 23, 2008, U.S. Appl. No. 11/261,688.
Notice of Allowance dated Dec. 24, 2009, U.S. Appl. No. 11/261,688.
Notice of Allowance dated Apr. 14, 2010, U.S. Appl. No. 11/261,688.
Office Action dated Mar. 4, 2008, U.S. Appl. No. 11/261,689.
Office Action dated Jan. 21, 2009, U.S. Appl. No. 11/261,689.
Office Action dated Oct. 2, 2009, U.S. Appl. No. 11/261,689.
Notice of Allowance dated Mar. 30, 2010, U.S. Appl. No. 11/261,689.

(Continued)

*Primary Examiner* — Chun Cao
(74) *Attorney, Agent, or Firm* — Kwan & Olynick LLP

(57) ABSTRACT

Methods and apparatus are provided for allowing efficient clock domain crossing management in programmable chip systems. Components associated with different clock domains can be analyzed. Clock domain crossing components are automatically selected from a library of clock domain crossing components to allow connection between disparate clock domains. Clock domain crossing components can be shared, chained, and intelligently selected for increased efficiency.

20 Claims, 9 Drawing Sheets

OTHER PUBLICATIONS

Cadence, Technical Paper, "Clock Domain Crossing-Closing the Loop on Clock Domain Functional Implementation Problems", http://www.cadence.com/whitepapers/cdc.wp.pdf, 15 pages, 2004.

Altera Corporation, "AIRbus Interface", Functional Specification 9, Dec. 22, 2000, ver. 1.00, www.altera.com/literature/fs/fs9airbus.pdf, 8 pages.

Synopsys Products & Solutions, Technical Bulletin DesignWare, What's New in DesignWare IP?, Jul. 2004, 3 pages, www.synopsys.com.

Tundra, "Tsi310™: Transparent PCI-X Bus Bridge", downloaded Feb. 24, 2006, www.tundra.com, 4 pages.

News Release from Pericom Semiconductor Corp., Electronicstalk, "PCI-X bus bridge gains novel features", downloaded on Feb. 24, 2006, 2 pages.

Xilinx, WP123 (v.1.1) "Using FPGAs with ARM Processors", Aug. 18, 2000, 7 pages.

Synopsys, "DesignWare Library AMBA On-Chip Bus", no date.

\* cited by examiner

SELECTION OF PORT ADAPTERS FOR CLOCK CROSSING BOUNDARIES

CROSS-REFERENCE TO RELATED APPLICATIONS

This application is a continuation of co-pending U.S. patent application Ser. No. 11/261,688, filed Oct. 28, 2005, and titled "DESIGN TOOL CLOCK DOMAIN CROSSING MANAGEMENT", which is hereby incorporated by reference in its entirety.

The U.S. patent application Ser. No. 11/261,688 is related to U.S. patent application Ser. No. 11/261,689, filed Oct. 28, 2005, titled "DESIGN TOOL SELECTION AND IMPLEMENTATION OF PORT ADAPTERS", which is hereby incorporated by reference in its entirety.

BACKGROUND OF THE INVENTION

1. Field of the Invention

The present invention relates to clock domain crossing. In one example, the present invention relates to methods and apparatus for efficiently selecting and implementing clock domain crossing adapters on a programmable chip system.

2. Description of Related Art

Primary and secondary components in an embedded system are typically associated with a particular clock domain. In one example, a hardware accelerator may be configured to operate at one particular clock rate, such as 500 MHz, while memory is configured to operate at another clock rate, such as 100 MHz. The hardware accelerator can be connected to other components having the same 500 MHz clock rate without requiring clock domain crossing mechanisms. However, clock domain crossing mechanisms are required to allow the hardware accelerator to interact with 100 MHz components such as memory in this example. Sending signals across clock boundaries can lead to data integrity problems if the signals are not properly synchronized.

One problem that can occur is metastability. Metastability occurs when the output of a register is in an unknown, fluctuating state. For example, clocking signals into a flip-flop without the proper setup times can cause metastability. Clock domain crossing logic and synchronizers are used to prevent metastability. Some of the more common mechanisms for clock crossing are two-stage synchronizers and four-way handshake mechanisms. Implementing clock domain crossing logic and synchronizers is an error-prone and inefficient process. Consequently, a variety of tools have been developed to aid in clock domain crossing verification and analysis.

In some examples, the complexity associated with clock domain crossing leads designers to implement systems entirely using a single clock domain. For example, a 100 MHz hardware accelerator can be configured to operate with 100 MHz memory. However, selecting only components based on a single, strict clock constraint can lead to suboptimal designs.

Techniques and mechanisms for implementing clock domain crossing mechanisms have significant limitations. Consequently, it is desirable to provide improved methods and apparatus for allowing efficient clock domain crossing management for programmable chip systems.

SUMMARY OF THE INVENTION

Methods and apparatus are provided for allowing efficient clock domain crossing management in programmable chip systems. Components associated with different clock domains can be analyzed. Clock domain crossing components are automatically selected from a library of clock domain crossing components to allow connection between disparate clock domains. Clock domain crossing components can be shared, chained, and intelligently selected for increased efficiency.

In one embodiment, a clock domain crossing adapter is provided. The clock domain crossing adapter includes a slave port, a master port, synchronization logic, and identification information. The slave port is associated with a first clock domain in an embedded system on a programmable chip. The slave port is connected to a master component residing in the first clock domain. The master port is associated with a second clock domain in the embedded system on the programmable chip. The master port is connected to a slave component residing in the second clock domain. Synchronization logic is operable to allow signaling between the first clock domain and the second clock domain. Identification information is configured to allow the clock domain crossing adapter to be selected from a clock domain crossing library by a design tool during generation of the embedded system.

In another embodiment, a technique for selecting a clock domain crossing adapter is provided. Multiple components for implementation on a programmable chip are received. Desired connections between multiple master ports and multiple slave ports associated with the components are identified. Clock domain crossing boundaries associated with the desired connections are determined. A clock domain crossing adapter is selected from a clock domain crossing adapter library. Multiple master ports are connected to multiple slave ports using the clock domain crossing adapter.

These and other features and advantages of the present invention will be presented in more detail in the following specification of the invention and the accompanying figures, which illustrate by way of example the principles of the invention.

BRIEF DESCRIPTION OF THE DRAWINGS

The invention may best be understood by reference to the following description taken in conjunction with the accompanying drawings, which illustrate specific embodiments of the present invention.

DETAILED DESCRIPTION OF SPECIFIC EMBODIMENTS

Figure 1:
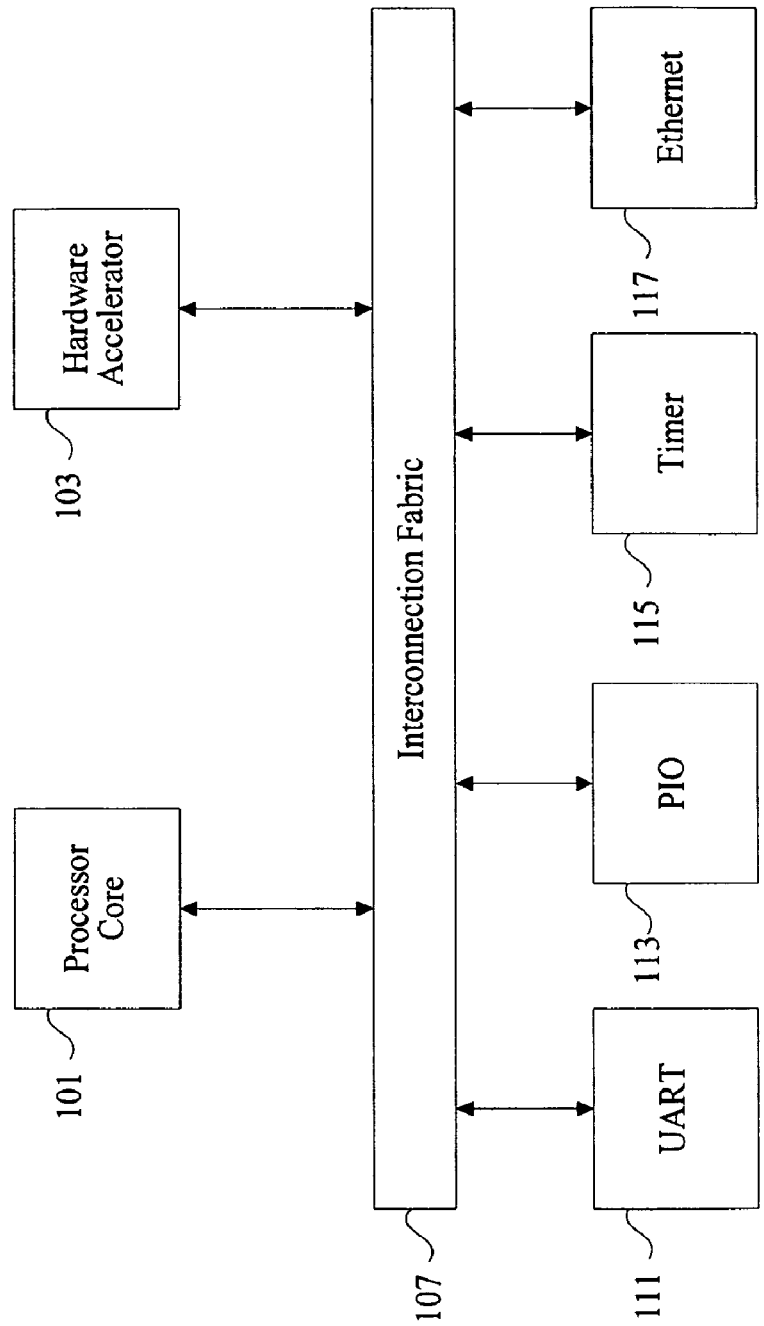
FIG. 1 is a diagrammatic representation of a programmable chip.

Reference will now be made in detail to some specific examples of the invention including the best modes contemplated by the inventors for carrying out the invention. Examples of these specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims.

For example, the techniques of the present invention will be described in the context of programmable chips, bus access, and slave side arbitration buses. However, it should be noted that the techniques of the present invention can be applied to a variety of devices and buses. In the following description, numerous specific details are set forth in order to provide a thorough understanding of the present invention. The present invention may be practiced without some or all of these specific details. In other instances, well known process operations have not been described in detail in order not to unnecessarily obscure the present invention.

Furthermore, techniques and mechanisms of the present invention will sometimes be described in singular form for clarity. However, it should be noted that some embodiments include multiple iterations of a technique or multiple instantiations of a mechanism unless noted otherwise. For example, a processor is used in a variety of contexts. However, it will be appreciated that multiple processors or no processors can also be used while remaining within the scope of the present invention unless otherwise noted.

Various components in embedded systems are typically associated with clocks. In some examples, various master and slave components are all required to run using the same clock. A system clock may run at 500 MHz and require that all components run at the same frequency. In other examples, various components reside in different clock domains. For example, a master component processor and a memory may be associated with a 500 MHz clock domain while a hardware accelerator may run at 1 GHz. In another example, a master component processor may have a 1 GHz data path and a 100 MHz control path. Consequently, a single component may reside in multiple domains. In order to allow signals to be passed from one clock domain to another clock domain, clock domain crossing logic is required. In many embedded systems, it is natural and efficient to separate the system into independently clocked domains. Having separate clock domains saves some of the area and power required for precise clock distribution over the entire chip and can increase efficiency by allowing selection of more optimal components. Communications with external real-time or pre-defined clocks also often require that embedded systems have multiple clock domains.

Signaling mechanisms between different clock domains are often difficult to design, analyze, and verify. Clock domain crossing signaling requires considerable effort to recognize possible synchronization problems, devise reliable solutions, and verify the effectiveness of the solutions. In many programmable chip systems, designers manually configure clock domain crossing logic to suit particular needs. The manually configured clock domain crossing logic then has to be analyzed and verified. It is often difficult to envision all of the possible corner cases and scenarios. Consequently, even though conventional mechanisms are available for implementing clock domain crossing logic, implementation remains error prone and inefficient.

Consequently, the techniques of the present invention provide mechanisms for automatically selecting clock domain crossing components from an adapter library. The clock domain crossing adapters may include identification information to allow a design tool to easily select the clock domain crossing adapters from the adapter library. Any mechanism including preconfigured components for implementing an embedded system is referred to herein as an adapter library. In some instances, the adapter library is a clock domain crossing adapter library. Clock domain crossing adapters or components are automatically selected where signaling occurs across different clock domains. Clock domain crossing adapters may implement synchronization logic that has been analyzed and verified. In some examples, clock domain crossing adapters are inserted anywhere a slave's master runs at a different frequency than the slave. In some examples, clock domain crossing adapters can include dual-clock First In First Out (FIFO) buffers or other buffering mechanisms that include address, write data, and control signals in one direction and read data in the other direction.

In one specific embodiment, a system-design tool collects an inventory of all of the clock domain crossing connections required in a design for implementation on a programmable chip. With this information, the tool then looks through a library of available clock domain crossing adapters to see how every required connection can be made. The tool then automatically inserts only the clock domain crossing adapters that are required to allow the desired port connections of the design.

FIG. 1 is a diagrammatic representation showing one example of a system on a programmable chip that can use the techniques of the present invention for selecting clock domain crossing adapters. The system includes a processor core, a hardware accelerator, peripheral devices, and peripheral interfaces. Peripheral devices and peripheral interfaces are herein referred to as components. The system on a programmable chip includes processor core 101 and a hardware accelerator 103 as well as peripheral components UART 111, PIO 113, timer 115, and Ethernet 117. In some examples, the hardware accelerator 103 is a Digital Signal Processing (DSP) core, a cryptography accelerator, or a video processor. The components are interconnected using an interconnection fabric 107. Any mechanism or logic for connecting components in a system is referred to herein as an interconnection fabric or bus.

The programmable chip uses different types of resources that can be interchangeably used in different allocations to implement the system on a programmable chip. In one example, the programmable chip uses logic elements for implementing each of the various components on the programmable chip.

Logic elements typically can be implemented using components such as antifuses, static RAM, and EPROMS. Any mechanism on a programmable chip that performs an operation on a given number of input lines to provide one or more outputs based on information programmed is herein referred to as a logic element. Some logic elements are implemented as combinations of look up tables and switches for performing Boolean operations on input lines. In one example, a logic element includes a 16-bit SRAM lookup table (LUT) that can implement an arbitrary 4-input logic function, circuitry that forms a fast carry chain and a fast cascade chain, a register and preset/reset logic for the register.

The techniques and mechanisms of the present invention allow the implementation of a system on a programmable chip with automatic port adapter selection and configuration.

Figure 2:
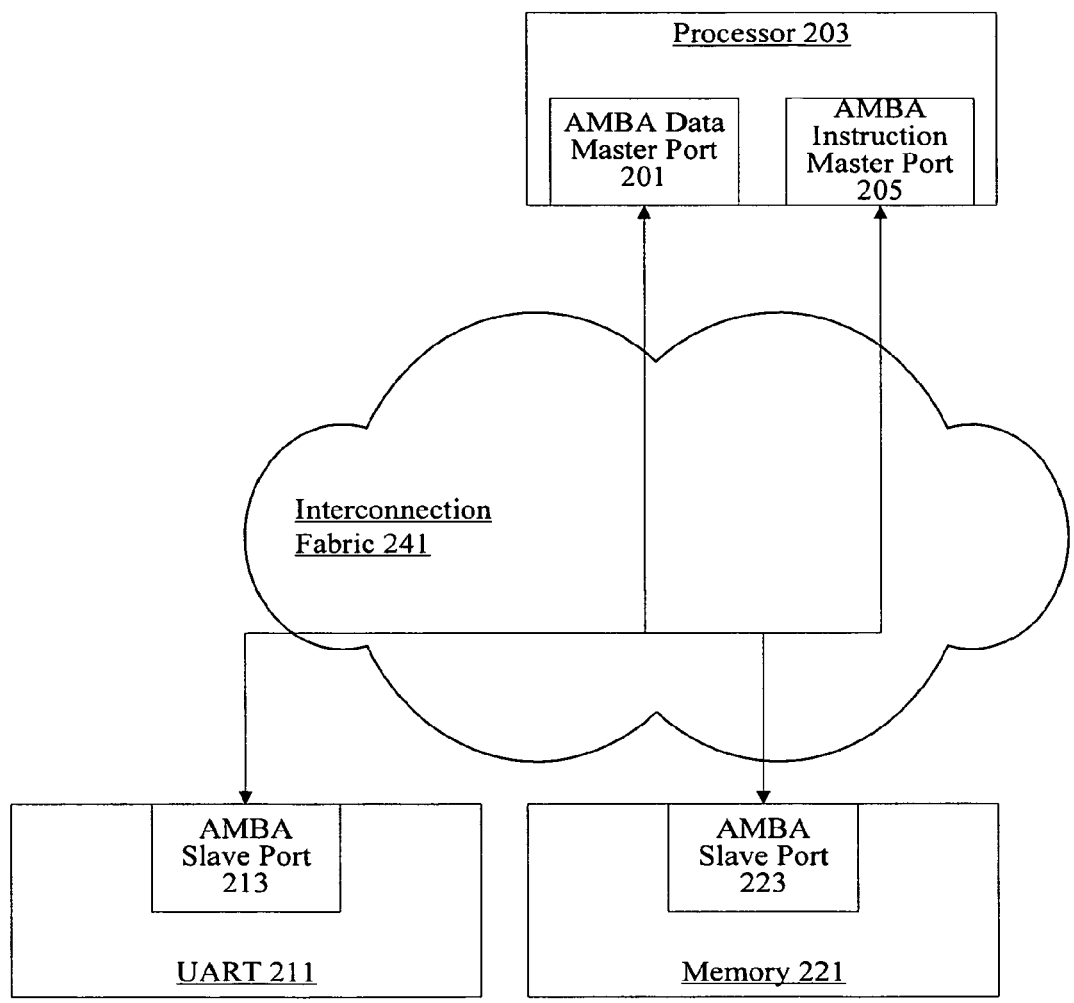
FIG. 2 is a diagrammatic representation showing master ports and slave ports associated with a programmable chip processor and peripherals.

FIG. 2 is a diagrammatic representation showing one example of a system having various components. A processor 203 includes an Advanced Microprocessor Bus Architecture (AMBA) data master port 201 and an AMBA instruction master port 205. AMBA is an established on-chip bus standard that serves as an interconnect for a number of System-on-Chip (SoC) designs. AMBA provides structure for intellectual property (IP) component development. A variety of components include AMBA ports and compliance with the AMBA standard allows connection of a variety of components without understanding of the intricacies associated with other components.

The AMBA instruction master port 205 and the AMBA data master port 201 are connected to an AMBA slave port 223 associated with a memory component 221 over an interconnection fabric 241. The interconnection fabric can include one or more bus controllers or bus arbiters. A UART 211 has an AMBA slave port 213.

In one example, the processor 203, the UART 211, and the memory 221 all operate in the same clock domain. However, in other instances, the processor 203 and memory 221 may operate in one clock domain while UART 211 operates in another clock domain. Designers typically custom configure logic to allow clock domain crossing. Custom configured logic can be error prone and inefficient.

Figure 3:
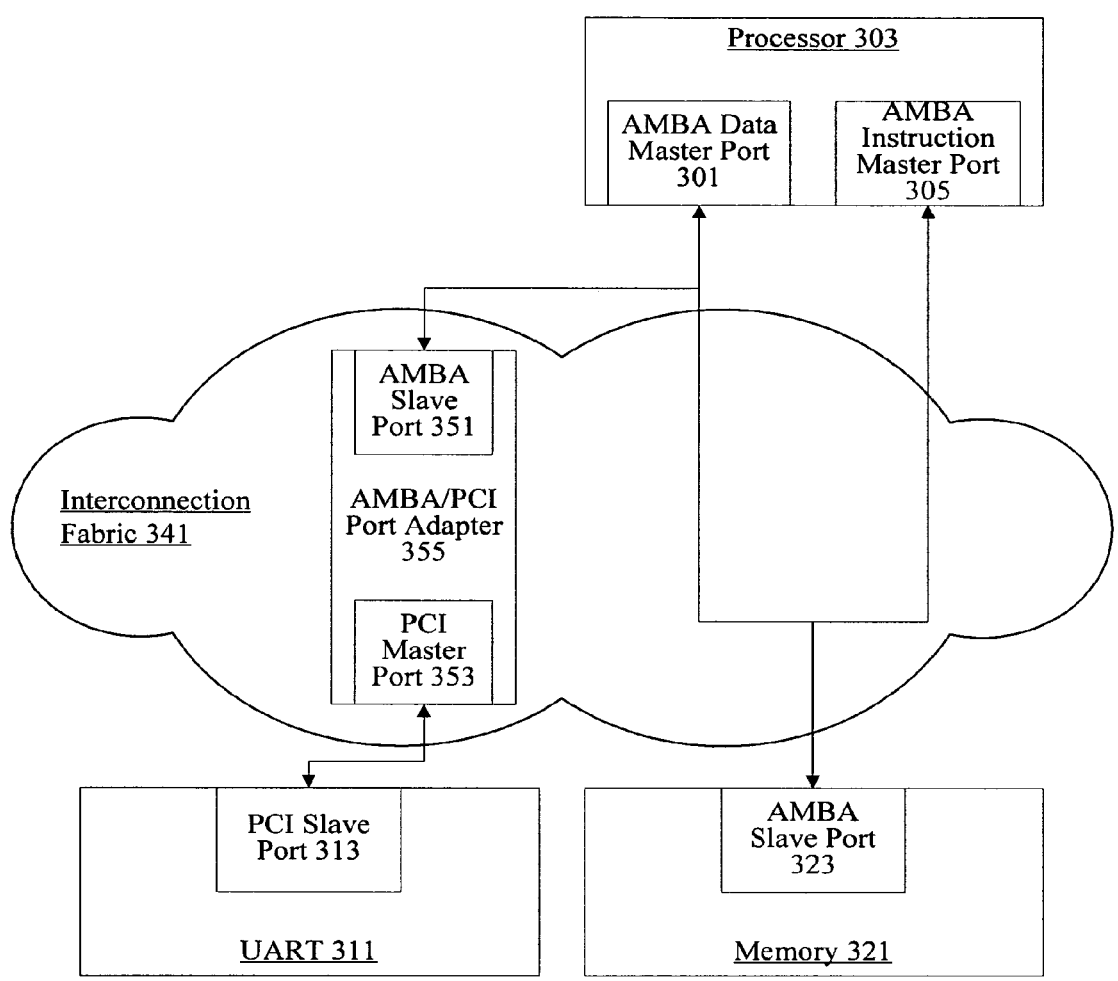
FIG. 3 is a diagrammatic representation showing a clock domain crossing adapter.

FIG. 3 is a diagrammatic representation showing use of a port adapter available from a port adapter library. Any mechanism holding logic such as IP blocks for implementing port adapters on a device is referred to herein as a port adapter library. In one embodiment, a port adapter library is a database that includes bus type adapters, bit width adapters, bursting adapters, clock domain crossing adapters, etc.

A processor 303 includes an Advanced Microprocessor Bus Architecture (AMBA) data master port 301 and an AMBA instruction master port 305. The AMBA instruction master port 305 and the AMBA data master port 301 are connected to an AMBA slave port 323 associated with a memory component 321 over an interconnection fabric 341. The interconnection fabric 341 can include one or more bus controllers or bus arbiters. A UART 311 has an AMBA slave port 313. In this example, the processor 303 and memory 321 operate in one clock domain while UART 311 operates in another clock domain. Designers typically custom configure logic to allow clock domain crossing. Instead of building custom configured logic to allow clock crossing, a clock domain crossing adapter 355 is selected from a library of clock domain crossing adapters to allow interaction between the clock domains. The clock domain crossing adapter may implement a two stage synchronizer or a four-way handshake mechanism to prevent metastability.

The clock domain crossing adapter AMBA master port 353 is connected to AMBA slave port 313 associated with UART 311. The port adapter AMBA slave port 351 is connected to the AMBA data master port 301 associated with processor 303. The preconfigured clock domain crossing adapter 355 reduces complexity in implementing a device. However, it is recognized that latency may increase. Port adapters available from a library may not be optimally configured for specific applications and may indeed slow transfers of data between the processor 303 and the UART 311. However, the techniques of the present invention recognize that the tradeoff is beneficial particularly when implemented using a system builder tool. A system builder or system design tool allowing a designer to select components for implementing a system on a chip or a system on a programmable chip emphasizes simplicity of design over latency. For more optimal latency, a component having the same clock rate can be used. A variety of clock domain crossing adapters are available.

The examples above describe point-to-point connections without "fan out" or "fan in." Such connections can be resolved easily using clock domain crossing adapters from a library and a backtracking search algorithm. According to various embodiments, an algorithm iteratively inserts candidate adapters from a library until the desired connection is possible. If necessary, when no adapter is available that directly connects the port types, the algorithm can search for a chain of adapters or stages of adapters. The algorithm can search for the adapter chain that resolves the connection with a minimum cost. According to various embodiments, costs are assigned to various adapters in the clock domain crossing adapter library. Costs may be associated with the amount of logic consumed on a device, latency introduced, etc. A solution with the lowest total cost may be selected.

A clock domain crossing adapter can implement a clock domain crossing algorithm. According to various embodiments, a clock domain crossing adapter is inserted by a design tool wherever a slave component's master runs at a different frequency than the slave. In some examples, the clock domain crossing adapter includes dual-clock FIFOs that carry address, write data, and control signals in one direction and read data in the other direction. FIFO sizes can be empirically determined or sizes can be estimated based on the maximum read latency of the slave components connected to the FIFO. According to various embodiments, no FIFO resources are used if no downstream slave components handle posted reads.

Figure 4:
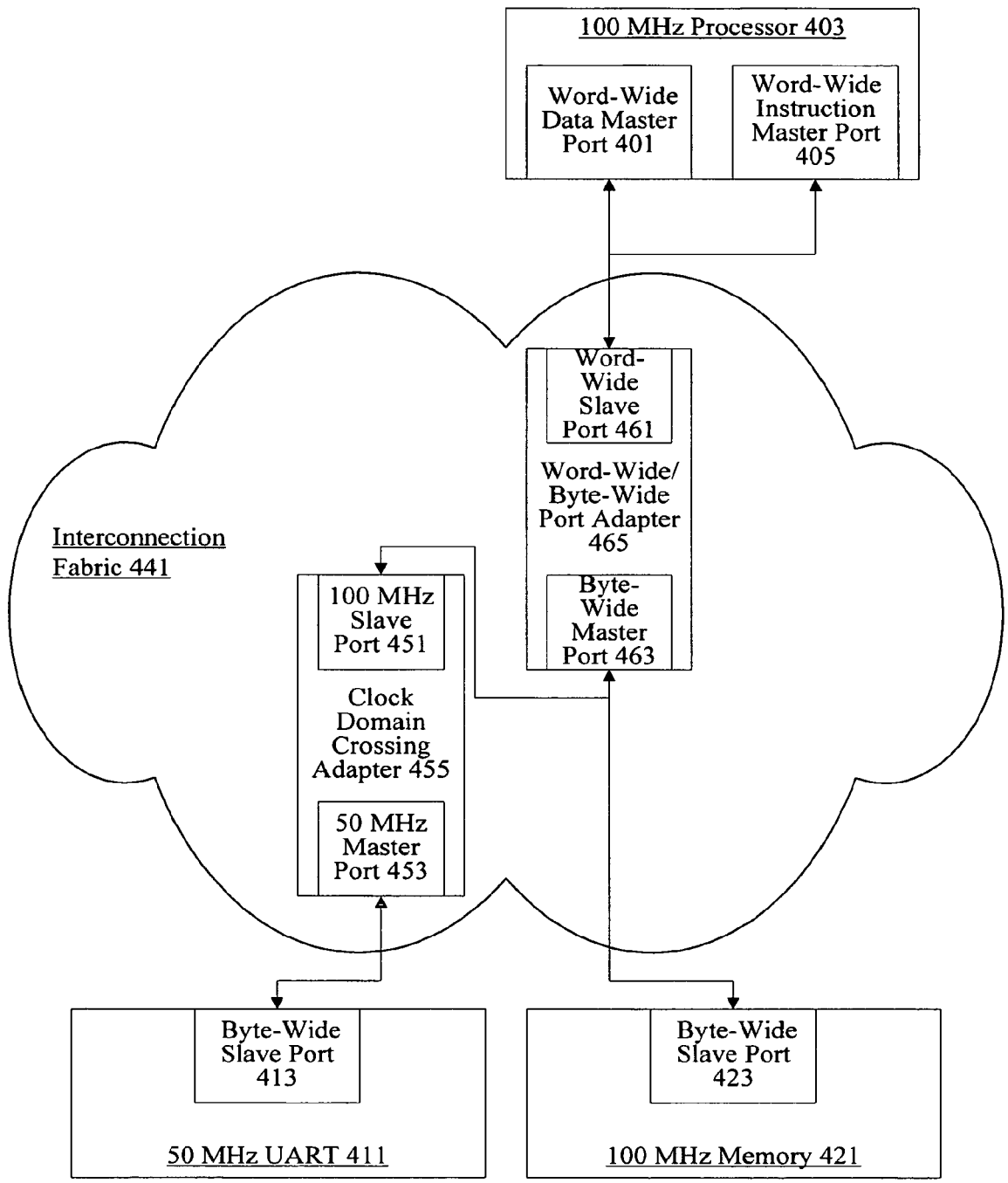
FIG. 4 is a diagrammatic representation showing clock domain crossing adapter chaining.

FIG. 4 is a diagrammatic representation showing one example of adapter chaining A 100 MHz processor 403 includes a word-wide data master port 401 and a word-wide instruction master port 405. The word-wide instruction master port 405 and the word-wide data master port 401 are connected to a word-wide slave port 461 associated with a word-wide/byte-wide port adapter 465 included in an interconnection fabric 441. The interconnection fabric 441 may include one or more arbitrators. According to various embodiments, the word-wide/byte-wide port adapter 465 has 100 MHz ports. The word-wide/byte-wide port adapter 465 also includes a byte-wide master port 463.

The byte-wide master port 463 associated with the word-wide/byte-wide port adapter 465 is connected to a byte-wide slave port 423 associated with 100 MHz memory 421. The 100 MHz processor 403 and the 100 MHz memory 421 reside in the same clock domain and do not require any clock domain crossing adapter. However, a word-wide/byte-wide adapter is used. A 50 MHz UART 411 is also a byte-wide peripheral like 100 MHz memory 421. Consequently, the techniques of the present invention recognize that a word-wide/byte-wide port adapter 465 available from a port adapter library can be shared by both memory 421 and UART 411.

However, the byte-wide master port 463 associated with the word-wide/byte-wide port adapter 465 can not be connected to the byte-wide slave port 413 associated with the 50 MHz UART because of synchronization problems. Consequently, the word-wide/byte-wide port adapter 465 is chained to a clock domain crossing adapter 455 to allow connection to UART 411. The byte-wide master port 463 is connected to the 100 MHz slave port 451 associated with the clock domain crossing adapter 455. The clock domain crossing adapter 455 also includes a 50 MHz master port 453. The 50 MHz master port 453 is connected to the 50 MHz byte-wide slave port 413. According to various embodiments, the clock domain crossing port adapter 455 has byte-wide ports.

Sharing of clock domain crossing adapters and port adapters generally is encouraged by considering total cost. A system implemented using fewer adapters will generally have lower total cost. However, in some instances, sharing too extensively can adversely impact system performance. In some instances, the clock domain crossing adapter itself may become a system bottleneck. In one example, clock domain crossing adapters may be shared by a maximum of three or four components. In another example, a clock domain crossing adapter is not shared if it is used by a high bandwidth component.

Figure 5:
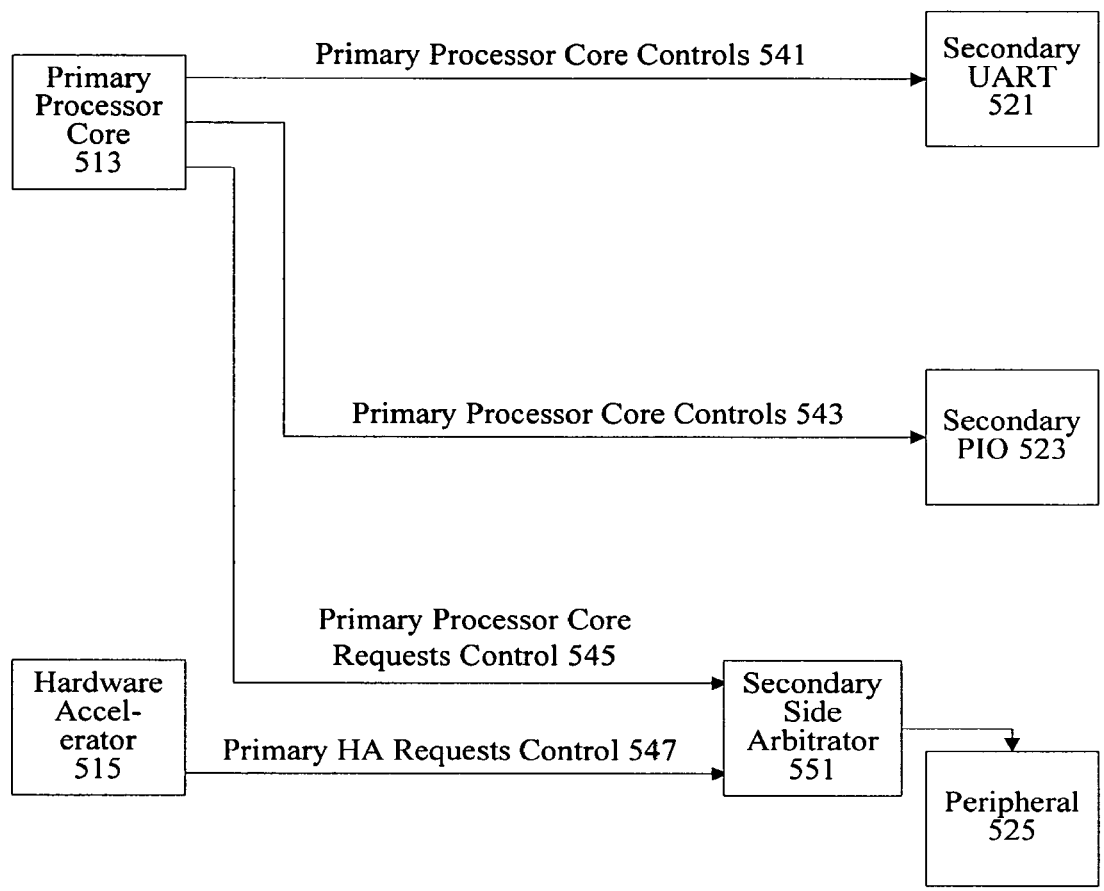
FIG. 5 is a diagrammatic representation showing an interconnection fabric.

A variety of interconnection fabrics can be used. FIG. 5 is a diagrammatic representation showing one example of an interconnection fabric. Although a slave side arbitration fabric is described, the techniques and mechanisms of the present invention can be implemented using other interconnection fabrics and buses. Any system level mechanism used to connected primary and secondary components is referred to herein as an interconnection fabric or bus. Any component or device that is operable to initiate read and write operations by providing control information is referred to herein as a primary component. Primary components are sometimes referred to as master components. Control information can include a particular address associated with a secondary component. Any component or device that responds to read or write operations with information sent back to the primary component regarding the read or write operation is referred to herein as a secondary component. Secondary components are sometimes referred to as slave components.

Some examples of primary components are processors, microcontrollers, and Ethernet devices. Some examples of secondary components are Universal Asynchronous Receiver Transmitters (UARTs), Parallel Input Output (PIO), program memory, and data memory. It should be noted that some components such as an Ethernet component can be both a primary component and a secondary component, as an Ethernet component has the capability of reading and writing to the secondary program memory while also responding to instructions from a primary system CPU.

The multiple primary and secondary components are connected using secondary side arbitration, sometimes referred to as slave side arbitration, simultaneous multiple primary components, or simultaneous multiple masters. A system using individual arbitrators that correspond to individual secondary components accessible by more than one primary component is referred to herein as a secondary side arbitration system. Any component or device that is configured to ensure that only one primary component can access any one of the secondary components at any given time is referred to herein as a system bus arbitrator or bus arbitration logic. Various schemes such as weighted fairness can be implemented to improve the efficiency of secondary component access, but such schemes can increase system complexity and latency. In conventional implementations, a computer system includes a single system bus arbitrator for each bus in the computer system.

A secondary side arbitration system no longer requires a bus or a system bus arbitrator that prevents a second primary component from accessing a second secondary component when a first primary component is accessing a first secondary component. According to various embodiments a secondary component such as peripheral interface 525 is associated with a secondary side arbitrator 551. Logic and mechanisms for selecting an input based on a bus control signal are referred to herein as an arbitrator or arbitration logic. It should be noted that although switching circuitry generally can be implemented using multiplexers, a variety of mechanisms including switches and transistors can be used.

However, secondary components UART 521 and PIO 523 are not associated with any arbitrator. In one example, secondary component UART 521 and secondary PIO 523 can only be accessed by primary CPU 513 and not by primary Ethernet device 515. A peripheral interface 525, however, can be accessed by both primary CPU 513 and primary Ethernet device 515.

According to various embodiments, a secondary side arbitrator 551 allows a first secondary component in a system to be accessed by a first primary component at the same time a second secondary component in the system is accessed by a second primary component. For example, peripheral interface 525 can be accessed by primary Ethernet 515 through secondary side arbitrator 551 at the same time, secondary UART 521 is accessed by primary CPU 513.

By allowing a CPU to access a secondary component at the same time another primary component such as a streaming output device or an Ethernet component is accessing memory, bus bottlenecks can be reduced. By using the simultaneous multiple primary component architecture, more direct connections between components can also be supported.

Although secondary side arbitrators provide many benefits to programmable chip designers, arbitration logic efficiency is still needed to prevent performance degradation. It is also beneficial to provide priority considerations and fairness with any arbitration logic, secondary side arbitration logic or otherwise. According to various embodiments, port adapters available from a port adapter library can be connected serially to secondary side or slave side arbitrators.

Figure 6:
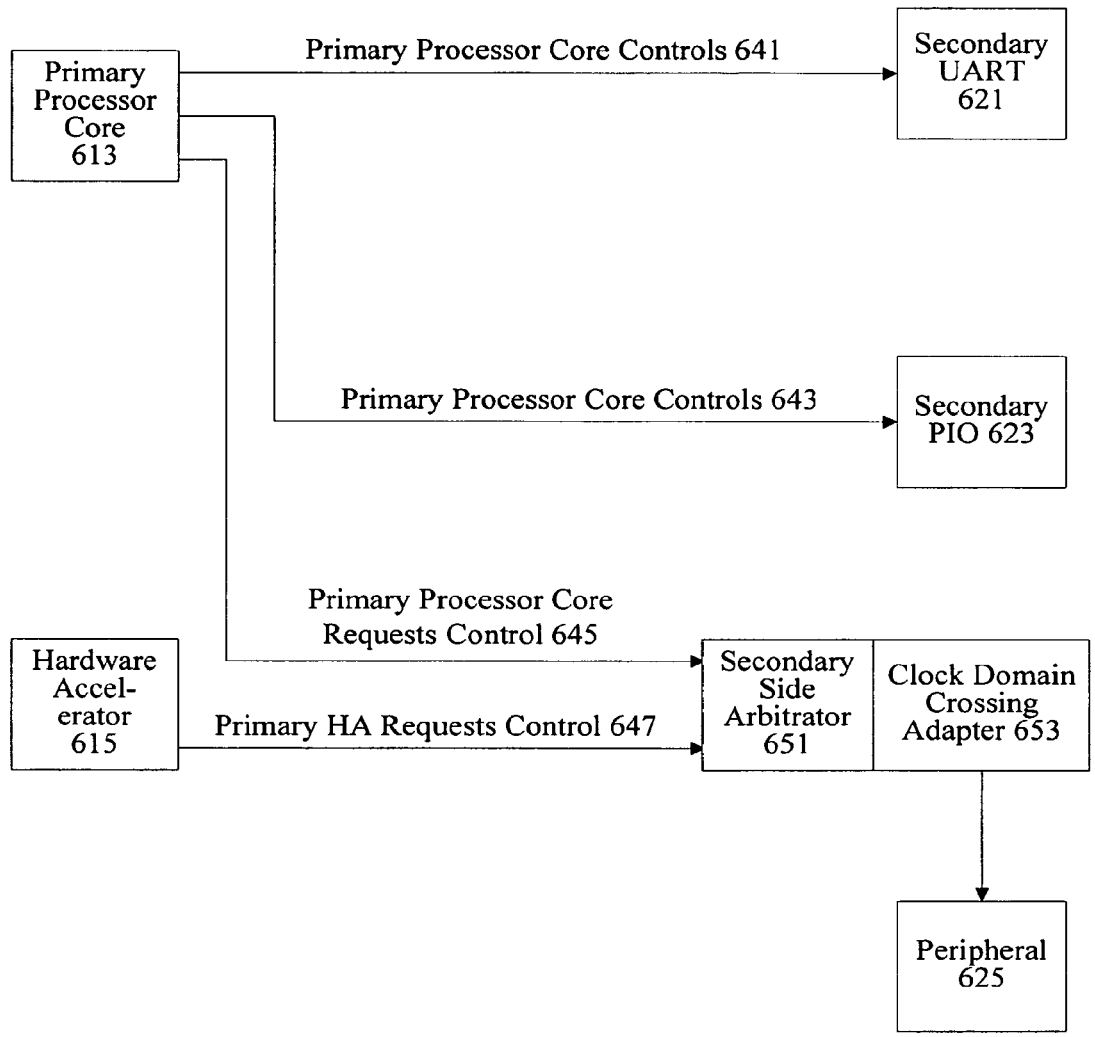
FIG. 6 is a diagrammatic representation showing port adapter components associated with arbitration logic.

FIG. 6 is a diagrammatic representation showing clock domain crossing adapters integrated with slave side arbitrators. According to various embodiments a secondary component such as peripheral interface 625 is associated with a secondary side arbitrator 651 and a clock domain crossing adapter 653.

However, secondary components UART 621 and PIO 623 are not associated with any arbitrator. In one example, secondary component UART 521 and secondary PIO 623 can only be accessed by primary CPU 613 and not by primary Ethernet device 615. A peripheral interface 625, however, can be accessed by both primary CPU 613 and primary Ethernet device 615. Secondary components UART 621 and PIO 623 may also be connected to clock domain crossing adapters as needed.

Figure 7:
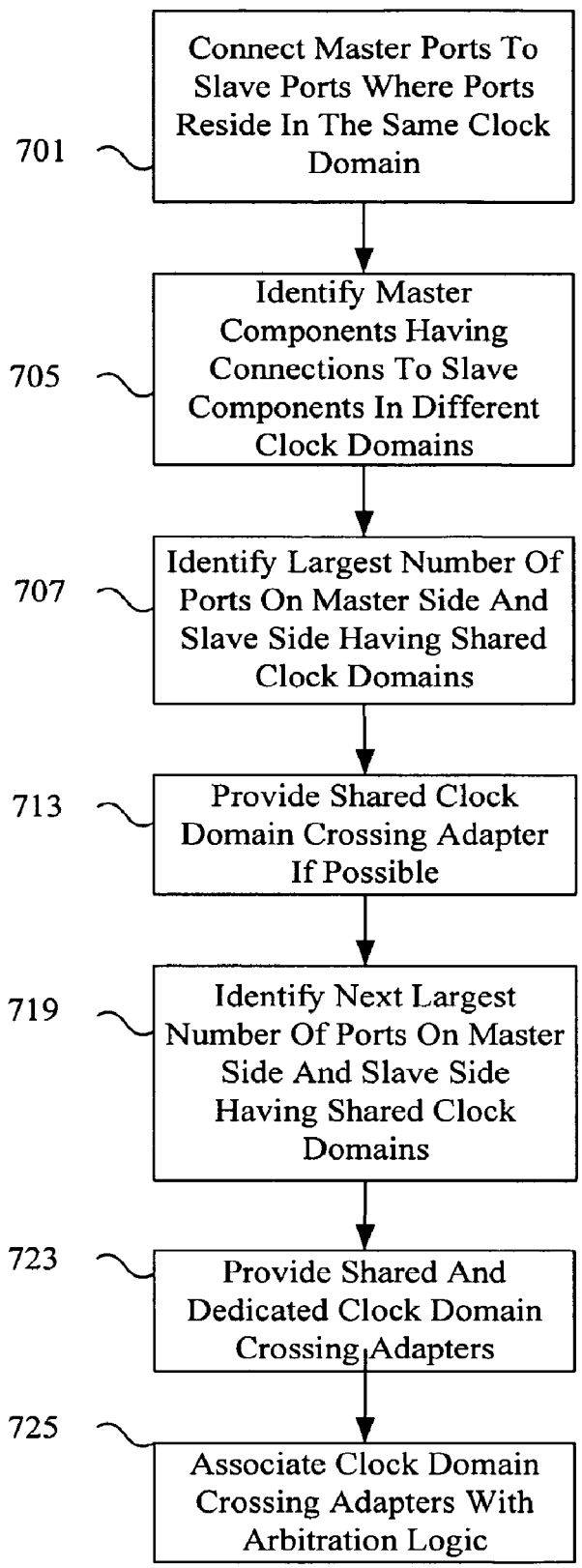
FIG. 7 is a flow process diagram showing one technique for selecting clock domain crossing adapter components.

FIG. 7 is a flow process diagram showing one technique for implementing a system using clock domain crossing adapters. It should be recognized that the techniques described can also be used to select port adapters generally. At 701, master ports and slave ports residing in the same clock domain are connected. The connections do not require clock domain crossing adapters but may require other adapters such as bursting adapters, bit width adapters, bus type adapters, etc. At 705, master ports having connections to slave port in different clock domains are identified. For example, a processor operating at 1 GHz may have a master port connected to a slave ports associated with a 500 MHz hardware accelerator.

At 707, the largest number of ports on the master side and slave side having a shared clock domain is determined. For example, there may be three slave ports associated with a 500 MHz clock domain. At 713, a shared clock domain crossing adapter is provided if possible. At 719, the next largest number of ports on the master side and slave side having a shared clock domain is determined. At 723, shared and dedicated clock domain crossing adapters are provided as needed. At 725 clock domain crossing adapters are associated with arbitration logic. It should be noted that a variety of techniques are contemplated for selecting clock domain crossing adapters. Iterative, cot weighting, and graphing techniques can be used.

Figure 8:
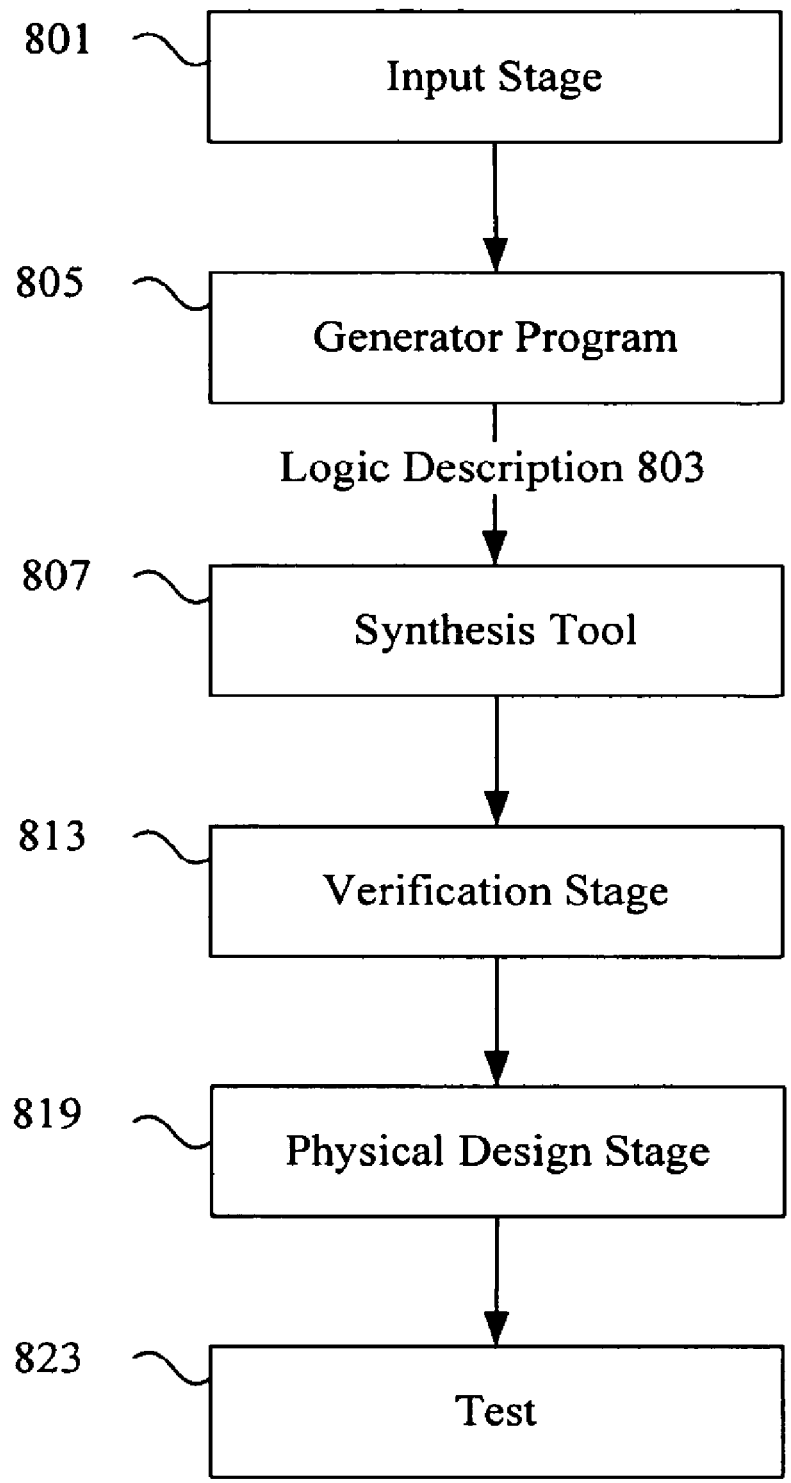
FIG. 8 is a diagrammatic representation showing a technique for implementing the programmable chip.

FIG. 8 is a diagrammatic representation showing implementation of an electronic device that can use clock domain crossing adapters according to various embodiments. An input stage 801 receives selection information typically from a user for logic such as a processor core as well as other components such as a streaming output device to be implemented on an electronic device. In one example, the input received is in the form of a high-level language program. A generator program 805 creates a logic description and provides the logic description along with other customized logic to any of a variety of synthesis tools, place and route programs, and logic configuration tools to allow a logic description to be implemented on an electronic device.

In one example, an input stage 801 often allows selection and parameterization of components to be used on an electronic device. The input stage 801 also allows configuration of variable or fixed latency support. In some examples, components provided to an input stage include intellectual property functions, megafunctions, and intellectual property cores. The input stage 801 may be a graphical user interface using wizards for allowing efficient or convenient entry of information. The input stage may also be a text interface or a program reading a data file such as a spreadsheet, database table, or schematic to acquire selection information. The input stage 801 produces an output containing information about the various modules selected.

In typical implementations, the generator program 805 can identify the selections and generate a logic description with information for implementing the various modules. The generator program 805 can be a Perl script creating HDL files such as Verilog, Abel, VHDL, and AHDL files from the module information entered by a user. In one example, the generator program identifies a portion of a high-level language program to accelerate. The other code is left for execution on a processor core. According to various embodiments, the generator program 805 identifies pointers and provides ports for each pointer. One tool with generator program capabilities is System on a Programmable Chip (SOPC) Builder available from Altera Corporation of San Jose, Calif. The generator program 805 also provides information to a synthesis tool 807 to allow HDL files to be automatically synthesized. In some examples, a logic description is provided directly by a designer. Hookups between various components selected by a user are also interconnected by a generator program. Some of the available synthesis tools are Leonardo Spectrum, available from Mentor Graphics Corporation of Wilsonville, Oreg. and Synplify available from Synplicity Corporation of Sunnyvale, Calif. The HDL files may contain technology specific code readable only by a synthesis tool. The HDL files at this point may also be passed to a simulation tool.

As will be appreciated by one of skill in the art, the input stage 801, generator program 805, and synthesis tool 807 can be separate programs. The interface between the separate programs can be a database file, a log, or simply messages transmitted between the programs. For example, instead of writing a file to storage, the input stage 801 can send messages directly to the generator program 805 to allow the generator program to create a logic description. Similarly, the generator program can provide information directly to the synthesis tool instead of writing HDL files. Similarly, input stage 801, generator program 805, and synthesis tool 807 can be integrated into a single program.

A user may select various modules and an integrated program can then take the user selections and output a logic description in the form of a synthesized netlist without intermediate files. Any mechanism for depicting the logic to be implemented on an electronic device is referred to herein as a logic description. According to various embodiments, a logic description is an HDL file such as a VHDL, Abel, AHDL, or Verilog file. A logic description may be in various stages of processing between the user selection of components and parameters to the final configuration of the device. According to other embodiments, a logic description is a synthesized netlist such as an Electronic Design Interchange Format Input File (EDF file). An EDF file is one example of a synthesized netlist file that can be output by the synthesis tool 807.

A synthesis tool 807 can take HDL files and output EDF files. Tools for synthesis allow the implementation of the logic design on an electronic device. Some of the available synthesis tools are Leonardo Spectrum, available from Mentor Graphics Corporation of Wilsonville, Oreg. and Synplify available from Synplicity Corporation of Sunnyvale, Calif. Various synthesized netlist formats will be appreciated by one of skill in the art.

A verification stage 813 typically follows the synthesis stage 807. The verification stage checks the accuracy of the design to ensure that an intermediate or final design realizes the expected requirements. A verification stage typically includes simulation tools and timing analysis tools. Tools for simulation allow the application of inputs and the observation of outputs without having to implement a physical device. Simulation tools provide designers with cost effective and efficient mechanisms for both functional and timing verification of a design. Functional verification involves the circuit's logical operation independent of timing considerations. Parameters such as gate delays are disregarded.

Timing verification involves the analysis of the design's operation with timing delays. Setup, hold, and other timing requirements for sequential devices such as flip-flops are confirmed. Some available simulation tools include Synopsys VCS, VSS, and Scirocco, available from Synopsys Corporation of Sunnyvale, Calif. and Cadence NC-Verilog and NC-VHDL available from Cadence Design Systems of San Jose, Calif. After the verification stage 813, the synthesized netlist file can be provided to physical design tools 819 including place and route and configuration tools. A place and route tool typically locates logic cells on specific logic elements of a target hardware device and connects wires between the inputs and outputs of the various logic elements in accordance with logic required to implement an electronic design. The device can also be physically tested at 823.

For programmable logic devices, a programmable logic configuration stage can take the output of the place and route tool to program the logic device with the user selected and parameterized modules. According to various embodiments, the place and route tool and the logic configuration stage are provided in the Quartus Development Tool, available from Altera Corporation of San Jose, Calif. As will be appreciated by one of skill in the art, a variety of synthesis, place and route, and programmable logic configuration tools can be tested using various techniques of the present invention.

As noted above, different stages and programs can be integrated in a variety of manners. According to one embodiment, the input stage 801, the generator program 805, the synthesis tool 807, the verification tools 813, and physical design tools 819 are integrated into a single program. The various stages are automatically run and transparent to a user. The program can receive the user selected modules, generate a logic description depicting logic for implementing the various selected modules, and implement the electronic device. As will be appreciated by one of skill in the art, HDL files and EDF files are mere examples of a logic description. Other file formats as well as internal program representations are other examples of a logic description.

Figure 9:
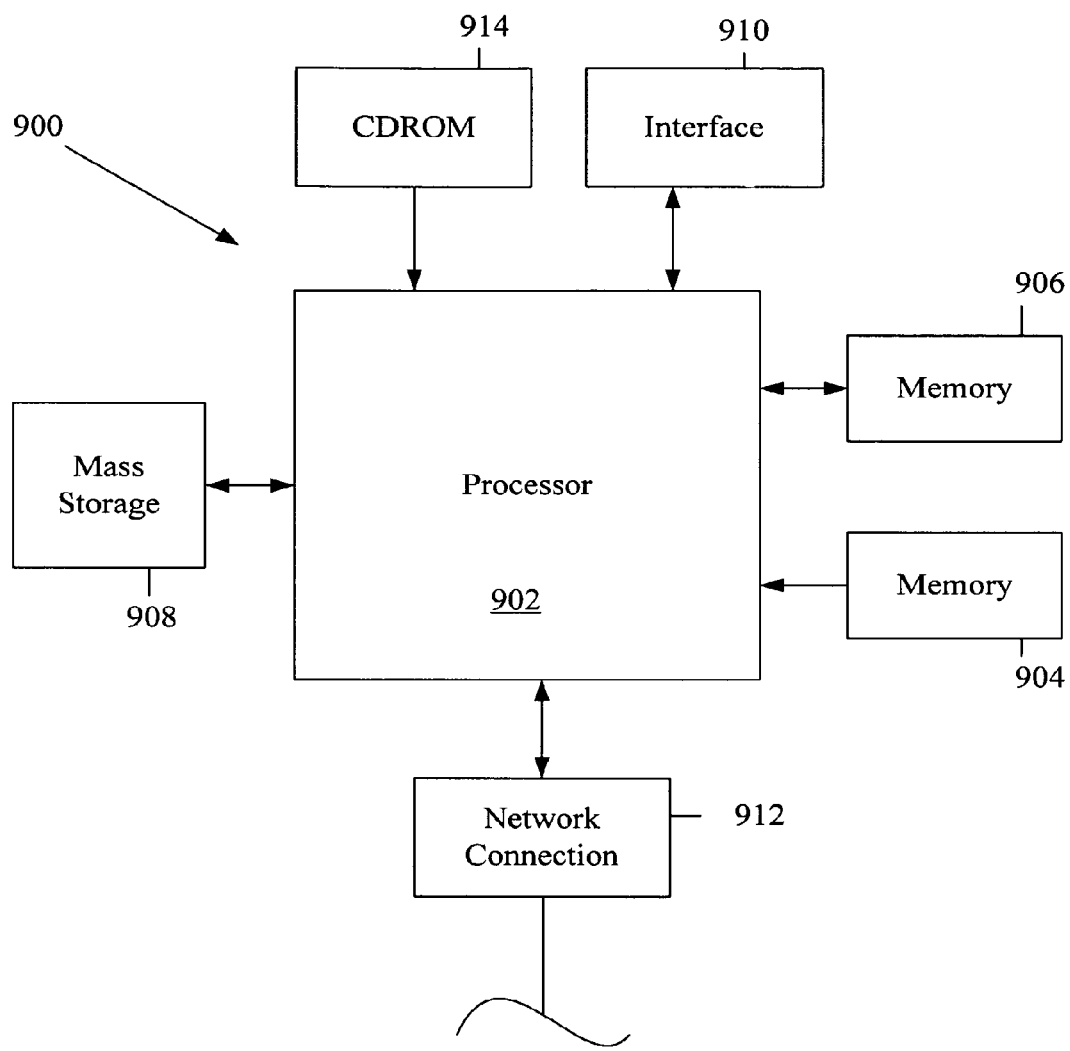
FIG. 9 is a diagrammatic representation depicting a computer system.

FIG. 9 is a diagrammatic representation showing a typical computer system that can be used to implement a programmable chip having bus arbitration with priority encoding and fairness. The computer system 900 includes any number of processors 902 (also referred to as central processing units, or CPUs) that are coupled to devices including memory 906 (typically a random access memory, or "RAM"), memory 904 (typically a read only memory, or "ROM"). The processors 902 can be configured to generate a test sequences for any designated processor. As is well known in the art, memory 904 acts to transfer data and instructions uni-directionally to the CPU and memory 906 is used typically to transfer data and instructions in a bi-directional manner.

Both of these memory devices may include any suitable type of the computer-readable media described above. A mass storage device 908 is also coupled bi-directionally to CPU 902 and provides additional data storage capacity and may include any of the computer-readable media described above. The mass storage device 908 may be used to store programs, data and the like and is typically a secondary storage medium such as a hard disk that is slower than memory. The mass storage device 908 can be used to hold a library or database of prepackaged logic or intellectual property functions, as well as information on generating particular configurations. It will be appreciated that the information retained within the mass storage device 908, may, in appropriate cases, be incorporated in standard fashion as part of memory 906 as virtual memory. A specific mass storage device such as a CD-ROM 914 may also pass data uni-directionally to the CPU.

CPU 902 is also coupled to an interface 910 that includes one or more input/output devices such as such as video monitors, track balls, mice, keyboards, microphones, touch-sensitive displays, transducer card readers, magnetic or paper tape readers, tablets, styluses, voice or handwriting recognizers, or other well-known input devices such as, of course, other computers. Finally, CPU 902 optionally may be coupled to a computer or telecommunications network using a network connection as shown generally at 912. With such a network connection, it is contemplated that the CPU might receive information from the network, or might output information to the network in the course of performing the above-described method steps. It should be noted that the system 900 may also be associated with devices for transferring completed designs onto a programmable chip. The above-described devices and materials will be familiar to those of skill in the computer hardware and software arts.

The hardware elements described above may be configured (usually temporarily) to act as multiple software modules for performing the operations of this invention. For example, instructions for running a generator program, input stage (e.g., a wizard), and/or compiler may be stored on mass storage device 908 or 914 and executed on CPU 908 in conjunction with primary memory 906.

Although many of the components and processes are described above in the singular for convenience, it will be appreciated by one of skill in the art that multiple components and repeated processes can also be used to practice the techniques of the present invention.

While the invention has been particularly shown and described with reference to specific embodiments thereof, it will be understood by those skilled in the art that changes in the form and details of the disclosed embodiments may be made without departing from the spirit or scope of the invention. For example, embodiments of the present invention may be employed with a variety of primary and secondary components and should not be restricted to the ones mentioned above. Although shared I/O lines have been described in the context of a memory controller and a simultaneous multiple primary component switch fabric, shared I/O lines can be used in a system without a memory controller and/or without a simultaneous multiple primary component switch fabric. It is therefore intended that the invention be interpreted to include all variations and equivalents that fall within the true spirit and scope of the present invention.

What is claimed is:

1. A method comprising:
   identifying a clock crossing boundary between a master component port of first port type operating in a first clock domain and a slave component port of a second port type operating in a second clock domain; and
   selecting a chain of adapters to couple the first port type to the second port type upon determining that an adapter from a port adapter library is not available to couple the first port type to the second port type, wherein the chain of adapters is selected by using a processor to evaluate a plurality of costs associated with each adapter of a plurality of adapters from the port adapter library.

2. The method of claim 1, wherein the plurality of costs associated with each adapter of the plurality of adapters includes an amount of logic used.

3. The method of claim 1, wherein the plurality of costs associated with each adapter of the plurality of adapters includes an amount of latency introduced.

4. The method of claim 1, wherein the chain of adapters having minimum cost is selected.

5. The method of claim 1, wherein the port adapter library includes a plurality of clock crossing adapters.

6. The method of claim 1, wherein the port adapter library includes a plurality of bit width adapters.

7. The method of claim 1, wherein the port adapter library includes plurality of bursting adapters.

8. A system comprising:
   persistent storage operable to maintain a port adapter library; and
   a processor operable to identify a clock crossing boundary between a master component port of a first port type operating in a first clock domain and a slave component port of a second port type operating in a second clock domain, wherein the processor is further operable to select a chain of adapters to couple the first port type to the second port type upon determining that no adapter is available to couple the first port type to the second port type, wherein the chain of adapters is selected by evaluating a plurality of costs associated with each adapter of a plurality of adapters from the port adapter library.

9. The system of claim 8, wherein the plurality of costs associated with each adapter of the plurality of adapters includes an amount of logic used.

10. The system of claim 8, wherein the plurality of costs associated with each adapter of the plurality of adapters includes an amount of latency introduced.

11. The system of claim 8, wherein the chain of adapters having minimum cost is selected.

12. The system of claim 8, wherein the port adapter library includes a plurality of clock crossing adapters.

13. The system of claim 8, wherein the port adapter library includes a plurality of bit width adapters.

14. The system of claim 8, wherein the port adapter library includes a plurality of bursting adapters.

15. A computer readable medium comprising:
   computer code for identifying a clock crossing boundary between a master component port of a first port type operating in a first clock domain and a slave component port of a second port type operating in a second clock domain; and
   computer code for selecting a chain of adapters to couple the first port type to the second port type upon determining that an adapter from a port adapter library is not available to couple the first port type to the second port type, wherein the chain of adapters is selected by using a processor to evaluate a plurality of costs associated with a plurality of adapters from the port adapter library.

16. The computer readable medium of claim 15, wherein the plurality of costs associated with each of the plurality of adapters includes an amount of logic used.

17. The computer readable medium of claim 15, wherein the plurality of costs associated with each of the plurality of adapters includes an amount of latency introduced.

18. The computer readable medium of claim 15, wherein the chain of adapters having minimum cost is selected.

19. The computer readable medium of claim 15, wherein the port adapter library includes a plurality of clock crossing adapters.

20. The computer readable medium of claim 15, wherein the port adapter library includes a plurality of bit width adapters.

* * * * *